United States Patent [19]

Heinecke et al.

[11] Patent Number: 4,488,506
[45] Date of Patent: Dec. 18, 1984

[54] METALLIZATION PLANT

[75] Inventors: Rudolf A. H. Heinecke, Harlow; Ronald C. Stern, Cheshunt; Michael J. Cooke, Harlow, all of England

[73] Assignee: ITT Industries, Inc., New York, N.Y.

[21] Appl. No.: 388,774

[22] Filed: Jun. 15, 1982

[30] Foreign Application Priority Data

Jun. 18, 1981 [GB] United Kingdom ............... 8118809

[51] Int. Cl.³ ........................................... C23C 13/08
[52] U.S. Cl. .................................. 118/667; 118/666; 118/688; 118/726; 118/719; 118/725; 118/692; 62/55.5
[58] Field of Search ............... 118/692, 667, 726, 663, 118/715, 719, 688, 725, 666, 689, 690; 427/253; 62/55.5; 134/4

[56] References Cited

U.S. PATENT DOCUMENTS

| | | | |
|---|---|---|---|
| 2,916,593 | 12/1959 | Herrick | 118/725 X |
| 3,160,517 | 12/1964 | Jenkin | 118/725 X |
| 3,206,325 | 9/1965 | Auerbach | 118/719 |
| 3,637,422 | 1/1972 | Landingham et al. | 427/253 X |
| 3,791,158 | 2/1974 | Tempelmeyer | 62/55.5 |
| 4,328,261 | 5/1982 | Heinecke et al. | 427/252 X |

OTHER PUBLICATIONS

Chappelow et al., "Controlling (Reaction) Pressure in CVD Tools", IBM. Technical Disclosure Bulletin, vol. 18, No. 7, Dec. 1975, pp. 2082-2083.

*Primary Examiner*—John D. Smith
*Assistant Examiner*—Bernard F. Plantz
*Attorney, Agent, or Firm*—James B. Raden; Marvin M. Chaban

[57] ABSTRACT

An apparatus for depositing metal or alloy films by a thermal decomposition process on a substrate includes a furnace having a number of selectively heated zones The temperature of each zone is controllable so as to provide compensation for changes in the concentration of reactant materials in the different regions of the furnace. Means are provided for the safe handling of highly pyrophoric organometallic reactants. The apparatus may be used for the deposition of aluminium/silicon alloy films on semiconductor wafers in the manufacture of integrated circuits.

4 Claims, 1 Drawing Figure

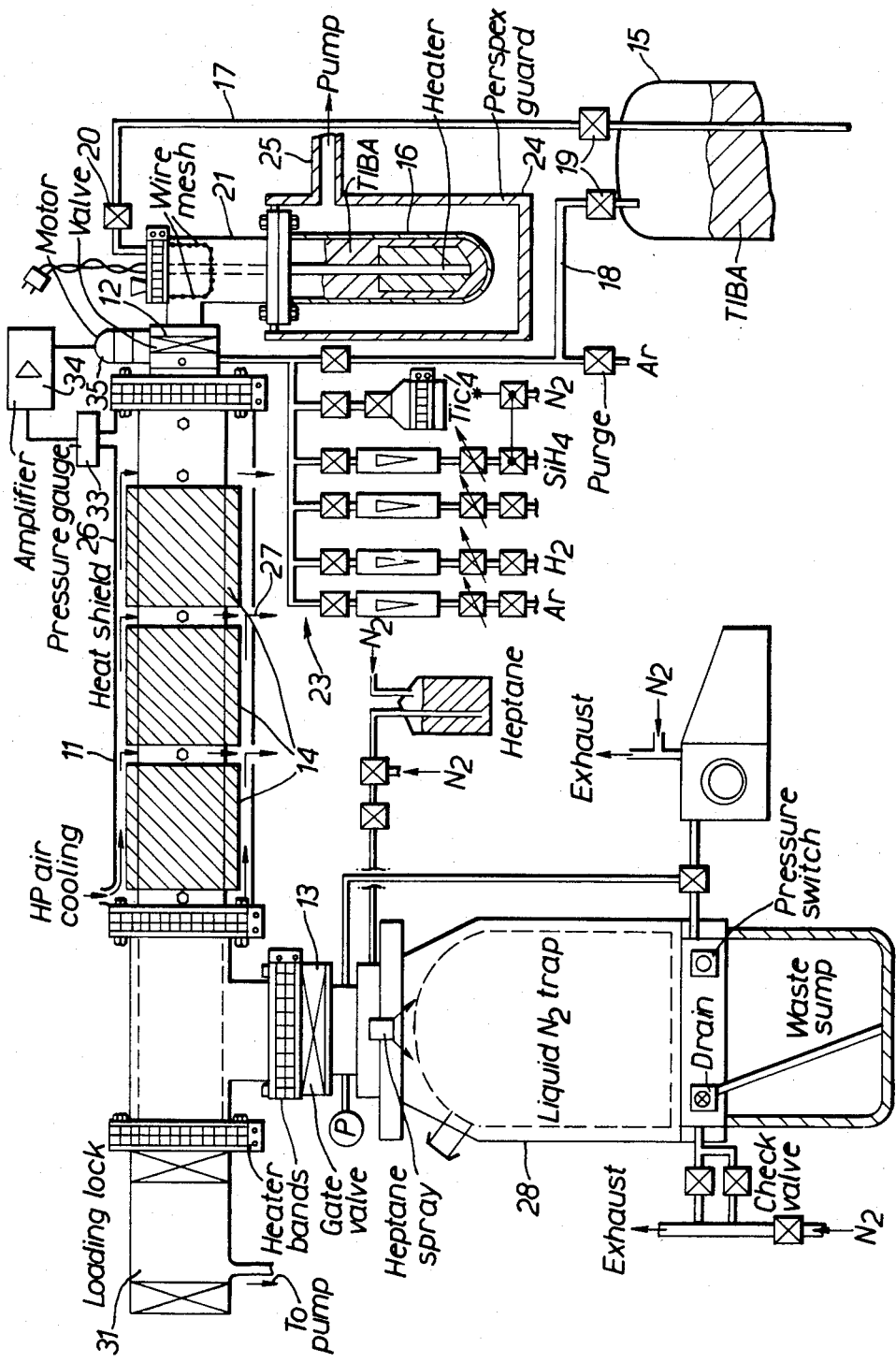

METALLIZATION PLANT

This invention relates to apparatus for depositing metal film on a solid substrate and in particular for depositing metallisation layers on semiconductor devices and integrated circuits.

Our co-pending British application Nos. 43914/78 (R. A. H. Heinecke-R. C. Stern 25-10) now represented by U.S. Pat. No. 4,328,261 issued May 4, 1982, and 7938793 (R. A. H. Heinecke-R. C. Stern 26-11) describe processes for depositing pure and doped aluminium films on a solid substrate, e.g. an integrated circuit, via a thermal decomposition process. In such a process a volatile organo-aluminium compound, typically tri-isobutyl aluminium (TIBA), is thermally decomposed to effect deposition of aluminium metal on a substrate surface. The apparatus described in the aforementioned applications comprised a chamber wherein thermal decomposition was effected and to which an organoaluminium compound was supplied. Whilst such a system provides effective metallisation of integrated circuits the number of semiconductor wafers that can be treated simultaneously is limited as the effective volume of the chamber within which deposition is effected is restricted by changes in the gas composition produced by decomposition of the aluminium compound. Also such a system must be operated by skilled personnel who are expert in the handling of the unstable and highly pyrophoric reactant materials.

The object of the present invention is to provide a thermal deposition apparatus in which compensation for changes in the reactant gas composition is provided for over a sufficiently large region to allow a plurality of semiconductor wafers to be treated simultaneously. A further object of the invention is to provide an apparatus in which the reactant materials are handled with the minimum risk of spillage or decomposition prior to reaction, and provide safe disposal of waste products.

According to one aspect of the invention there is provided an apparatus for depositing a metal or alloy film on a solid substrate by thermal decomposition of one or more volatile metal compounds, the apparatus including a vessel for receiving a quantity of the liquified metal compound and from which the compound is supplied by evaporation to a deposition zone, wherein means are provided whereby the dynamic vapour pressure of the volatile compound within the deposition zone is maintained at a substantially constant value.

According to another aspect of the invention there is provided an apparatus for depositing a metal or alloy film on solid substrates by thermal decomposition of one or more volatile metal compounds, the apparatus including a vessel for receiving a quantity of the liquified metal compound and from which the compound is supplied by evaporation to a deposition zone, wherein means are provided for maintaining the vessel at a steady temperature at which said compound is substantially stable and for supplying heat to the liquid compound thereby replacing the latent heat of evaporation and controlling the rate at which the liquid is evaporated.

According to a further aspect of the invention there is provided an apparatus for depositing a metal or alloy film on solid substrates by thermal decomposition of one or more volatile metal compounds, the apparatus including a chamber for receiving said substrates for response to the volatile compounds and comprising a plurality of zones each of which is provided with heating means, and control means whereby, in use, the temperature of each said zone is selectively controlled via the respective heating means such that the deposition rate of the metal or alloy in each said zone is substantially uniform.

By providing an evaporator of relatively large cross-section a large liquid surface area is obtained. Thus a high evaporation rate can be provided whilst maintaining the liquid at a temperature below that at which instability leading to undesirable side reactions becomes noticeable.

Advantageously the vapour pressure of the volatile metal compound in the reaction chamber is monitored to provide a feedback signal whereby the rate at which the active material is admitted to the chamber is controlled. This provides a high degree of process control.

By providing selective temperature control of various regions of the deposition chamber compensation for changes in the gas composition due to depletion of the reactant species can be provided for. This allows simultaneous coating to a substantially uniform thickness of a plurality of substrate workpieces placed in the various regions of the deposition chamber.

An embodiment of the invention will now be described with reference to the accompanying drawing in which a single FIGURE in a schematic diagram of a metal deposition apparatus.

Referring to the drawing, the deposition apparatus may be constructed from stainless steel ultra high vacuum (UHV) parts and includes a furnace chamber or tube 11 wherein metal deposition is effected and to which the active reactant vapour is supplied via a gate valve 12. Diluent gases and other reactive materials are supplied via manifold 23 which comprises an array of gas valves 231 and flowmeters 232. Waste gases from the furnace are removed via gate valve 13. Gates valves are used in the apparatus to provide a minimum restriction to the gas flow.

It is advantageous to provide a fast and efficient pumping system to ensure that a relatively hard vacuum is provided. Typically we employ a turbomolecular pump to provide a vacuum better than $10^{-6}$ mbar. The fewer traces of residual air that are left in the apparatus the lower the risk of contamination of the reactant materials.

Advantageously access to the furnace chamber 11 is provided by a loading lock 31 provided with a vacuum pump. Process wafers to be coated with aluminium are loaded into the furnace chamber 11 via this lock which is evacuated prior to transfer of the wafers into the chamber. This prevents atmospheric contamination of the chamber thereby considerably extending the period between cleaning or maintainence operations.

To achieve deposition uniformity the furnace 11 comprises a number, typically three, of independently heated zones 14. It will be appreciated that the concentration of reactive gases is a function of the position along the tube and that compensation for these differences in concentration can be effected by temperature control of heated zone 14 such that the temperature of each said zone is matched to the active gas concentration in the zone. Thus the temperature towards the outlet end of the furnace 11 is maintained higher than that at the inlet end to ensure that the rate at which the metal is deposited is substantially uniform throughout the furnace. To achieve this temperature control the heated zone 14 may be provided with thermocouples which provide feedback signals to control a power supply from which the heaters are operated. The mechanism of the deposition reaction is detailed in our aforementioned co-pending applications Nos. 43914/76 and 7938793. The temperature stability of the furnace tube 11 may be enhanced by the provision of a heat shield 26.

We prefer to employ a metal, e.g. stainless steel, furnace tube as this provides a high rate of heat transfer and has been found to eliminate substantially the flaking of material from built-up surface layers. Also a metal furnace tube can be readily sealed to UHV standards to other apparatus components.

The organo-aluminium supply to the furnace tube 11 is effected in the liquid phase from a storage tank 15 coupled to an evaporator 16 via a syphon tube 17. With gate valves 12 and 13 in open position for out gassing the cold evaporator is charged with the liquid organo-aluminium by pressurising the storage tank 15 with dry, oxygen free, argon via an inlet tube 18 thus displacing the liquid through the syphon tube 17 to the evaporator 16. When the evaporator 16 is fully charged valves 19 and 20 are employed to isolate the storage reservoir from the remainder of the system. Splashing of the liquid into the furnace tube 11 during the out gassing phase may be prevented by a fine wire mesh baffle 21 disposed in the evaporator 16 above the liquid surface. After out gassing gate valves 12 and 13 are closed and the evaporator is heated to its operating temperature.

The evaporator 16 may comprise a stainless steel or glass container of relatively large cross section. This presents a large surface area of the liquid to the low pressure in the reaction system and thus allows a relatively high evaporation rate to be obtained at temperatures below those at which the liquid becomes unstable. Many organometallic compounds, e.g. TIBA, spontaneously decompose at moderately elevated temperatures. Thus TIBA decomposes to di-isobutyl aluminium hydride (DIBAH) starting at about 50° C. with consequent deleterious effects on the deposition process. The present arrangement overcomes this problem by permitting operation at temperatures below those at which this instability is manifested.

In one embodiment the organo-aluminium, e.g. TIBA, is supplied from the evaporator 16 to the furnace tube 11 at a controlled rate by supplying heat to the evaporator via a thermostatically controlled heater element 22 immersed in the liquid. By increasing or decreasing the amount of heat, which replaces the latent heat of evaporation, supplied to the evaporator the rate at which the liquid is evaporated into the furnace tube 11 can be increased or decreased correspondingly. This temperature control may be enhanced by insulating the evaporator with an outer container 24 which is evacuated via a tube 25.

In a preferred embodiment the rate at which the TIBA is supplied to the furnace chamber is controlled by a feed-back or servo arrangement. A pressure gauge 33 coupled to the furnace chamber 11 provides a corresponding output signal to a feedback amplifier 34, which in turn controls a drive motor 35 operating the valve 12. The arrangement can be preset to maintain a predetermined pressure in the furnace chamber so as to ensure uniformity of processing. Typically we employ pressures within the range 100 to 500 mtorr and advantageously 150 to 300 mtorr corresponding to an aluminium deposition rate of 100 to 200 A/min to produce high quality films. In applications where a lower quality film is acceptable a higher deposition rate can be employed.

Spent gases from the outlet of the furnace tube 11 are pumped via gate valve 13 through a cold trap 28 cooled with liquid nitrogen to remove the pyrophoric residue. Advantageously the trap surface is wetted with heptane from a spray nozzle 29 prior to cooling with liquid nitrogen. The heptane freezes when the trap is then cooled and provides a coating which prevents adherence of polymeric material produced from the spent gases. The trap may be periodically warmed, washed with heptane, and drained into a waste sump 30. Deposition of polymeric material on the other parts of the apparatus may be inhibited by fitting the various joints and valves with heater bands 31.

It will be appreciated that the reaction waste products will still contain a significant quantity of the highly pyrophoric TIBA, and in many previous deposition arrangements the disposal of this waste was difficult and hazardous. The present arrangement provides for dilution of the waste with an excess of heptane. We have found that when dissolved in heptane at a concentration below 20 weight percent the waste products are no longer pyrophoric and can then be safely handled for disposal in the same manner as other waste organic solvents.

Gases which have an undesirable effect on the collected waste products on the trap, for example titanium tetrachloride which catalyses polymerisation reactions, or silane which is used in gas phase alloying, are not passed through the cold trap but are fed directly into the pump which, for this purpose, is provided with nitrogen exhaust purging. The gases are sufficiently diluted that they can be vented to the atmosphere.

The risk of contamination of the liquid TIBA in the evaporation is minimised by arranging the inlet for the other gases, e.g. titanium tetrachloride and silane, downstream of the TIBA inlet. Any tendency of residual outgassing from the gas inlet to the evaporation is met by a countercurrent of evaporating TIBA.

The apparatus is constructed to permit all tubes which shall contain or transmit gases or liquids to be repeatedly evacuated and purged with substantially pure inert gas prior to use. This prevents contamination of the incoming materials and clogging with deposits caused by undesirable reactions with impurities. It further permits safe disassembly for maintenance purposes.

The apparatus may be used for metallising integrated circuits either with pure aluminium or, advantageously, with doped aluminium, for example an aluminium/silicon alloy. The function of such alloys is detailed in the two aforementioned co-pending applications.

Typically the apparatus permits deposition of metal or metal alloy films in the following way:

Substrates are introduced into the furnace tube, preferably via the load lock, heated and the tube is evacuated. A catalysing gas, typically titanium tetrachloride, is admitted and then pumped away. The plating gas is admitted and metal film is deposited. Typically the furnace temperature for this deposition is 240° to 270° C. In the case of aluminium film, this can be further alloyed with silicon by admitting a silicon bearing gas or gas mixture and adjusting the furnace temperature, e.g. 440° to 500° C., to permit the required degree of alloying. We prefer to employ a silane/hydrogen gas mixture for this alloying stage. The reactive gases are pumped away before the plated substrates are removed from the apparatus. The furnace is then cooled to the deposition temperature for the next batch of wafers, typically by directing high pressure air through openings 27 in the heat shield 26.

We claim:

1. An apparatus for depositing a metal or alloy film on solid substrates by thermal decomposition of one or more volatile metal compounds, comprising:

means for defining an enclosed deposition zone;

a vessel for receiving a quantity of the metal compound in liquified form and form which the compound evaporates as a volatile compound;

means for supplying the volatile compound from the vessel to the deposition zone; and means for maintaining the vessel at a steady temperature at which said compound is substantially stable and for supplying heat to the liquid compound therein at a rate sufficient for replacing the latent heat of evaporation and controlling the rate at which the liquid is evaporated and further comprising a cold trap for condensing spent reactant gases, and means for spraying the cold trap with an inert liquid which freezes on the cold trap to form a barrier layer thereon.

2. An apparatus for depositing a metal or alloy film on solid substrates by thermal decomposition of one or more volatile metal compounds, comprising:

a chamber for receiving said substrates for exposure to the volatile compounds, said chamber including a plurality of zones each of which is provided with heating means, and control means for selectively controlling the temperature of each of said zones via the respective heating means in such a manner in dependence on the depletion of the volatile compounds that the deposition rate of the metal or alloy in all of said zones is substantially the same and further comprising a cold trap for condensing spent reactant gases; and means for spraying the cold trap with an inert liquid which freezes on the cold trap to form a barrier layer thereon.

3. An apparatus as claimed in claim 1 or 2, and further comprising means for exposing the substrate to a surface catalyzing or activating gas prior to metallisation.

4. An apparatus as claimed in claim 1 or 2, and further comprising means for alloying a deposited metal film with a further vapour deposited element.

* * * * *